(12) United States Patent
Yu

(10) Patent No.: US 9,472,473 B2
(45) Date of Patent: Oct. 18, 2016

(54) METHOD AND DEVICE FOR TESTING A THIN FILM TRANSISTOR

(75) Inventor: Hongjun Yu, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 636 days.

(21) Appl. No.: 13/271,326

(22) Filed: Oct. 12, 2011

(65) Prior Publication Data

US 2012/0092037 A1    Apr. 19, 2012

(30) Foreign Application Priority Data

Oct. 15, 2010   (CN) .......................... 2010 1 0517764

(51) Int. Cl.
*H01L 21/66* (2006.01)
*G09G 3/00* (2006.01)

(52) U.S. Cl.
CPC ............... *H01L 22/14* (2013.01); *G09G 3/006* (2013.01); *H01L 2924/0002* (2013.01)

(58) Field of Classification Search
CPC .......... G01R 31/2625; G01R 31/2626; G01R 31/2623; G01R 31/3008; G01R 3/006; H01L 22/14
USPC .......................... 324/760.01, 760.02, 762.01
See application file for complete search history.

(56) References Cited

U.S. PATENT DOCUMENTS 5,057,775 A *  10/1991  Hall .......................... 324/760.01
5,539,326 A *   7/1996  Takahashi ............... G09G 3/006
                                                        324/678
5,550,484 A *   8/1996  Mitsumori et al. ...... 324/762.09
6,885,214 B1 *  4/2005  Su et al. .................. 324/754.28

(Continued)

FOREIGN PATENT DOCUMENTS

CN          101359613 A      2/2009
CN          101689886 A      3/2010

(Continued)

OTHER PUBLICATIONS

Donghan, Yang, et al; "Organic Semiconductor Heterojunction Introduction", Scientific Publishing Company, dated Apr. 3, 2008, 1 page.

(Continued)

*Primary Examiner* — Jermele M Hollington
*Assistant Examiner* — Dustin Dickinson
(74) *Attorney, Agent, or Firm* — Ladas & Parry LLP

(57) ABSTRACT

A method and device for testing a thin film transistor (TFT) provided on an array substrate are provided in an embodiment. The method comprises determining periods and signal amplitudes in each period of the gate electrode test voltage signal and the source-drain-electrode test voltage signal corresponding to the TFT characteristics to be tested, wherein both the gate electrode test voltage signal and the source-drain-electrode test voltage signal are alternative current signals; according to the period and the signal amplitude in each period of the gate electrode test voltage signal and those of the source-drain-electrode test voltage signal, applying the gate electrode test voltage signal to a gate electrode of the TFT to be tested, and applying the source-drain-electrode test voltage signal across source and drain electrodes of the TFT; and obtaining the TFT output signals related to the TFT characteristics to be tested.

14 Claims, 3 Drawing Sheets

(56) References Cited

U.S. PATENT DOCUMENTS

| | | |
|---|---|---|
| 2003/0204820 A1 | 10/2003 | Asano et al. |
| 2004/0232939 A1* | 11/2004 | Toro-Lira ............... G09G 3/006 324/760.02 |
| 2006/0125512 A1* | 6/2006 | Itagaki et al. ................ 324/770 |
| 2006/0152245 A1 | 7/2006 | Ahn et al. |
| 2008/0055211 A1* | 3/2008 | Ogawa ............................ 345/77 |
| 2008/0105891 A1* | 5/2008 | Chen ....................... H01L 22/14 257/99 |
| 2008/0224724 A1* | 9/2008 | Glazer et al. ................ 324/766 |
| 2009/0167739 A1* | 7/2009 | Tsubata ......................... 345/208 |
| 2010/0052654 A1* | 3/2010 | Wei et al. ....................... 324/97 |
| 2010/0190448 A1 | 7/2010 | Kuwana et al. |
| 2010/0225627 A1* | 9/2010 | Goh et al. ..................... 345/206 |
| 2010/0259527 A1* | 10/2010 | Odawara .............. G09G 3/3233 345/211 |
| 2011/0170031 A1* | 7/2011 | Son et al. ....................... 349/46 |
| 2011/0193586 A1* | 8/2011 | Kuo et al. ................ 324/762.08 |
| 2012/0092037 A1* | 4/2012 | Yu ............................ 324/762.01 |

FOREIGN PATENT DOCUMENTS

| | | | | |
|---|---|---|---|---|
| JP | 05-090373 | * | 4/1993 | ............. H01L 21/66 |
| JP | 05-090373 A | | 4/1993 | |

OTHER PUBLICATIONS

Chinese First Office Action, dated Apr. 2, 2013; Appln. No. 201010517764.X.

Second Chine Office Action dated Nov. 7, 2013; Appln. No. 201010517764.X.

Third Chinese Office Action dated Apr. 29, 2014; Appln. No. 201010517764.X.

Chinese Rejection Decision dated Sep. 30, 2014; Appln. No. 201010517764.X.

\* cited by examiner

METHOD AND DEVICE FOR TESTING A THIN FILM TRANSISTOR

BACKGROUND

Embodiments of the disclosed technology relate to a method and device for testing a thin film transistor (TFT) on an array substrate.

Thin film transistor liquid crystal displays (TFT-LCDs) have become the main kind of flat panel displays in market due to small volume, low power consumption, no radiation, and the like.

A liquid crystal panel of a LCD is generally formed by assembling together an array substrate and a color filter substrate with a liquid crystal layer interposed therebetween. The array substrate typically comprises a base substrate, on which gate lines and data lines intersecting with each other are provided to define a plurality of pixel units arranged in a matrix form. A thin film transistor (TFT) switching element and a pixel electrode are provided in each of the plurality of pixel units. The color filter substrate may comprise a common electrode formed thereon. The application of a voltage to the pixel electrode of a pixel unit is controlled by a gate signal, and the value of the voltage is determined by a source signal. Thus, the characteristics such as output and transfer characteristics of TFTs are very important for a TFT-LCD to work normally.

In design and manufacturing a TFT-LCD, after an array substrate is formed, the TFTs on the array substrate should be tested on the characteristics to obtain the relevant characteristic parameters and data. In this way, the design and the quality for the TFT-LCD can be examined and checked, and as well these characteristic parameters and data can provide supports for determining sources of failures and optimizing array substrate design and printed circuit board (PCB) signal design.

FIG. 1 is a schematic illustration of a TFT device. As shown in FIG. 1, a TFT comprises a gate electrode G, a source electrode S, and a drain electrode D, and on an array substrate, the gate electrode G is connected with a gate line, the source electrode S is connected with a data line, and the drain electrode is connected with a pixel electrode of a pixel unit. When the TFTs on the array substrate are tested on their characteristics, generally a voltage difference is maintained between the source electrode S (data line) and the drain electrode D (pixel electrode) of each TFT, each gate line (gate electrode) on the array substrate is scanned with a multilevel voltage, and the current ($I_d$) between a test signal line and a corresponding pixel electrode and its change are examined. In this method, the voltages applied to the electrodes (terminals) of each TFT are direct current voltages, and the multilevel voltage applied to a gate line is shown in FIG. 2.

When a same signal is applied to one TFT for a long time period, a time stress effect occurs and disadvantageously affects the characteristics of this TFT. In the above conventional method, because direct current signals are applied to the electrodes of a TFT, in which the gate electrode G is scanned with the multilevel voltage as shown in FIG. 2, a time stress effect tends to occur and make the test results inaccurate and deviate from the real situation, and the real status of the TFT cannot be obtained.

SUMMARY

An embodiment of the disclosed technology provides a method for testing a thin film transistor (TFT) provided on an array substrate comprising: determining periods and signal amplitudes in each period of a gate electrode test voltage signal and a source-drain-electrode test voltage signal corresponding to TFT characteristics to be tested, wherein both the gate electrode test voltage signal and the source-drain-electrode test voltage signal are alternative current signals; according to the period and the signal amplitude in each period of the gate electrode test voltage signal and those of the source-drain-electrode test voltage signal, applying the gate electrode test voltage signal to a gate electrode of the TFT, and applying the source-drain-electrode test voltage signal across the source and drain electrodes of the TFT; and obtaining TFT output signals related to the TFT characteristics to be tested.

Another embodiment of the disclosed technology provides a device for testing a thin film transistor (TFT) provided on an array substrate comprising: a control unit adapted to determine periods and signal amplitudes in each period of a gate electrode test voltage signal and a source-drain-electrode test voltage signal corresponding to TFT characteristics to be tested, wherein both the gate electrode test voltage signal and the source-drain-electrode test voltage signal are alternative current signals; a signal generating unit adapted to apply the gate electrode test voltage signal to a gate electrode of the TFT, and applying the source-drain-electrode test voltage signal across the source and drain electrodes of the TFT according to the period and the signal amplitude in each period of the gate electrode test voltage signal and those of the source-drain-electrode test voltage signal; and a measure unit adapted to obtain TFT output signals related to the TFT characteristics to be tested.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1:
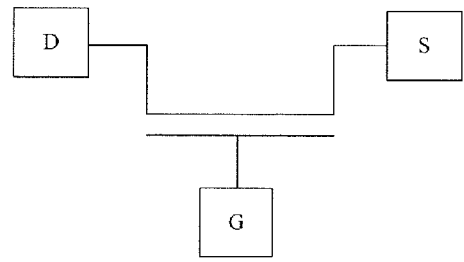
FIG. 1 is a schematic illustration of a TFT device.
Figure 2:
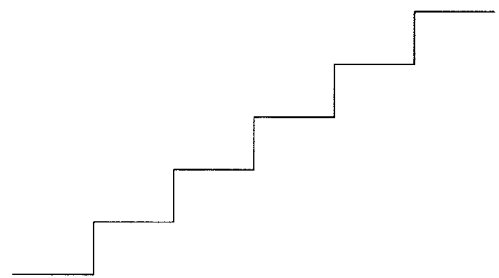
FIG. 2 is a voltage wave applied to a gate line in testing TFT characteristics.

Embodiments of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

An embodiment of the disclosed technology provides a method to test a TFT on an array substrate, and this method comprises the following steps.

Step 101, determining periods and signal amplitudes in each period of the gate electrode test voltage signal and the source-drain-electrode test voltage signal corresponding to the TFT characteristics to be tested.

In this embodiment, both the gate electrode test voltage signal and the source-drain-electrode test voltage signal are alternative current signals. Alternative current signals can be used to avoid the time stress effect that occurs to a TFT in the application of direct current signals for test, and furthermore alternative current signals are more approximate to the real driving voltage signals in operation. Thus, the test results can become more accurate, more precise characteristics of the TFT in operation can be obtained, and it is helpful to reduce the time for examining the TFT-LCD design and quality.

It should be noted that, in the embodiment of the disclosed technology, the TFT characteristics to be tested include, but not limited to, transfer characteristic, output characteristic, and the like.

In this step, there may be the following ways to determine periods of the gate electrode test voltage signal and the source-drain-electrode test voltage signal corresponding to the TFT characteristics to be tested and the signal amplitudes in each period.

The first exemplary way is to determine the periods and the signal amplitudes in each period of the gate electrode test voltage signal and the source-drain-electrode test voltage signal corresponding to the TFT characteristics to be tested according to an instruction of a user, that is, the periods and the signal amplitudes in each period of the gate electrode test voltage signal and the source-drain-electrode test voltage signal corresponding to the TFT characteristics to be tested are determined by a user.

The second exemplary way is to determine the periods and the signal amplitudes in each period of the gate electrode test voltage signal and the source-drain-electrode test voltage signal corresponding to the TFT characteristics to be tested according to the resolution of the array substrate where the TFT to be tested is provided; for example, if the array substrate has the resolution of 1024*768, one period of the gate voltage signal on array substrate is $\frac{1}{60}$ second (s) in a normal operation condition, and the period of the source-drain voltage signal (date signal) is comparable with that of the gate electrode voltage signals, thus when the TFT on the array substrate is tested for its characteristics, the periods of the gate voltage signal and the source-drain-electrode test voltage signal can be determined to be $\frac{1}{60}$s according to the resolution of the array substrate.

Further, it is appropriate to determine the signal amplitudes in each period of the gate electrode test voltage signal and the source-drain-electrode test voltage signal corresponding to the TFT characteristics to be tested according to the design parameters in TFT design, including the values of the gate electrode voltage and the source-drain-electrode voltage. For example, in design of an array substrate, the signal amplitudes in each period of the gate electrode test voltage signal can be determined based on the highest gate voltage (VgH) and the lowest gate voltage (VgL) of the TFT, and the signal amplitude in each period of the source-drain-electrode test voltage signal can be determined based on the source-drain-electrode voltage adopted in design.

In an example, the gate electrode test voltage signal and the source-drain-electrode test voltage signal employed in the embodiment of the disclosed technology are the same as or approximate to the real working voltage signals in a TFT-LCD in operation.

step 102, according to the period and the signal amplitudes in each period of the gate electrode test voltage signal and those of the source-drain-electrode test voltage signal, applying the gate electrode test voltage signal to the TFT to be tested, and applying the source-drain-electrode test voltage signal across the source and drain electrodes of the TFT.

Figure 3:
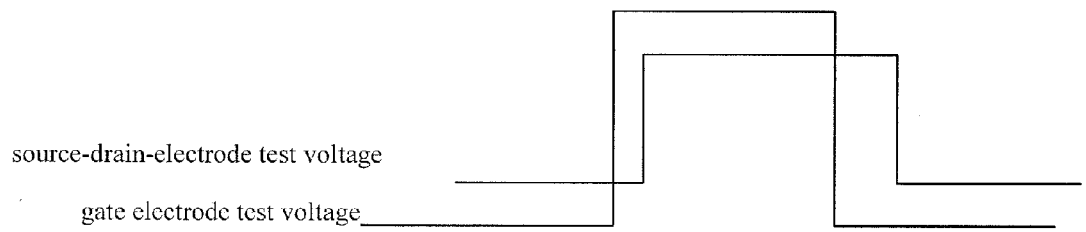
FIG. 3 shows a time sequence relationship between the gate electrode test voltage signal and the source-drain-electrode test voltage signal in an embodiment of the disclosed technology.

In this step, it should be noted that, according to the working principle of a TFT device, the gate voltage is applied to accumulate charge carriers to form a conductive channel in the active layer under the gate electrode, and the source-drain-electrode voltage across the electrodes gives rise to a current passing through the conductive channel. Therefore, the gate electrode test voltage signal and the source-drain-electrode test voltage signal may meet a certain time sequence relationship, so as to satisfy the time sequence relationship between the forming of the conductive channel and the generating of the current for ensuring the TFT to work stably and smoothly. One exemplary time sequence can be found in FIG. 3. As shown in FIG. 3, before the source-drain-electrode test voltage signal is applied across the source and drain electrodes of the TFT, the gate electrode test voltage signal first is applied to the gate electrode of the TFT.

Step 103, obtaining the TFT output signals related to the characteristics to be tested.

It should be noted, this step is conducted along with the step 102 because there are output signals only if there are input signals.

Next, after obtaining the output signals of the TFT, the method for testing the characteristics of a TFT on the array substrate according to the embodiment of the disclosed technology further comprises generating a characteristic curve of the characteristic under test according to the corresponding output signal, such that a user can perform analysis and examination based on the characteristic curve.

In addition, the method for testing the characteristics of the TFTs on the array substrate according to the embodiment of the disclosed technology, prior to the step 102, may further comprise: controlling the environmental temperature of the TFT and making it the same or similar to the working temperature when the TFT is in actual operation, and illuminating the TFT with light having brightness the same or similar to that of the light from a backlight when the array substrate with the TFT is in actual operation.

In this way, the test environment for the TFT would be more close to the environment in which the TFT is in actual operation, which is helpful to further improve the accuracy of test results and easier to catch the problem occurring when the TFT is in actual operation. Also, when a failure analysis is performed, this setting can reconstruct the conditions where the failure occurs and is helpful to determine the reason(s) of the failure.

Below, a specific example of the method for testing the characteristics of the TFT on the array substrate according to the embodiment of the disclosed technology will be described. In this example, the transfer characteristic of the TFT is the characteristic to be tested, the array substrate on which the TFT is provided has a resolution of 1024*768, the gate electrode test voltage signal is referred to as VG, the source electrode voltage is referred to as VS, the drain electrode voltage is referred to as VD, and the source-drain-electrode test voltage signal is referred to as VDS. This example comprises the following steps.

Step 201, determining periods and signal amplitudes in each period of VG and VDS of the TFT to be tested according to a user's instruction.

Step 202, applying VG to a gate electrode of the TFT to be tested, applying VD to the drain electrode of the TFT to be tested, and grounding the source electrode of the TFT to be tested.

Figure 4:
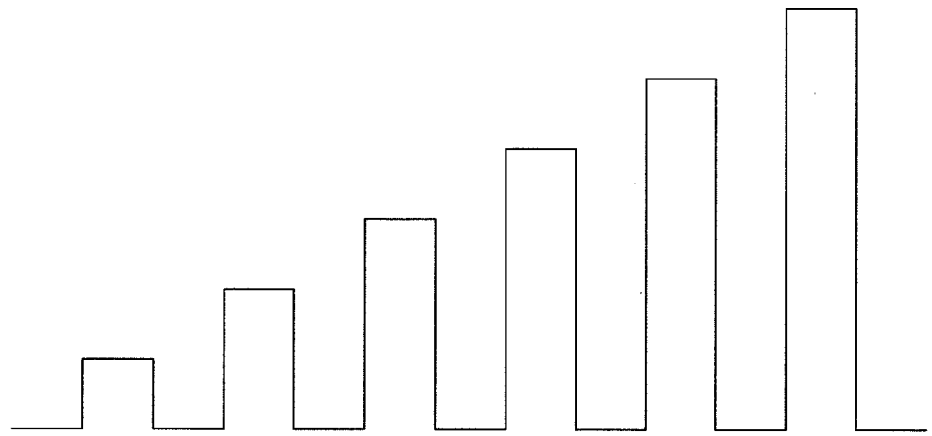
FIG. 4 shows the wave of a gate electrode test voltage signal.
Figure 5:
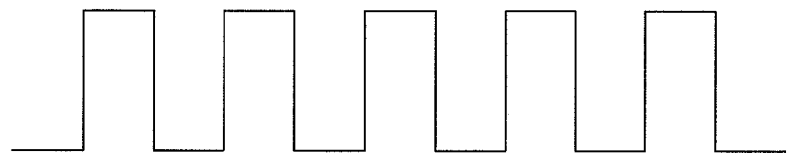
FIG. 5 shows the wave of a source-drain-electrode test voltage signal

In this example, both VG and VD are alternative current signals. The period of VG is 1/60s and scans between −20V and 20V with the wave as shown in FIG. 4; VS is grounded, that is, kept at 0V; VD has the wave as shown in FIG. 5 and is a pulsed square wave with an amplitude of 15V and the same period as that of VG; and VDS is equal to VD and also is a pulsed square wave of 15V. Further, VG and VD meet the time sequence relationship as shown in FIG. 3. As illustrated in FIGS. 4 and 5, the period means the time for applying a high level voltage and a low level voltage successively. Therefore, the period of the gate electrode test voltage signal and the period of the source-drain-electrode test voltage signal are constant successive periods.

Step 203, obtaining an output signal-drain electrode current ($I_d$) corresponding to the transfer characteristic of the TFT under test and generating a transfer characteristic curve of the TFT under test.

Another specific example of the method for testing the characteristics of the TFTs on the array substrate according to the embodiment of the disclosed technology will be described, and in this example, the output characteristic of the TFT is the characteristic to be tested, and the array substrate on which the TFT is provided has a resolution of 1024*768. This example comprises the following steps.

Step 301, determining periods and signal amplitudes in each period of VG and VDS in connection with the output characteristic of the TFT to be tested according to a user's instruction.

Step 302, applying VG to a gate electrode of the TFT to be tested, applying VD to the drain electrode of the TFT to be tested, and grounding the source electrode of the TFT to be tested.

In this example, both VG and VD are alternative current signals. The period of VG is 1/60s and scans between 0V and 25V with the wave as shown in FIG. 4; VS is grounded, that is, kept at 0V; VD has the wave as shown in FIG. 4 and scans from 0V to 15V with the same period as that of VG; and VDS is equal to VD. Further, VG and VD meet the time sequence relationship as shown in FIG. 3.

Step 303, obtaining an output signal-drain electrode current (Id) corresponding to the output characteristic of the TFT under test and generating a transfer characteristic curve of the TFT under test.

Figure 6:
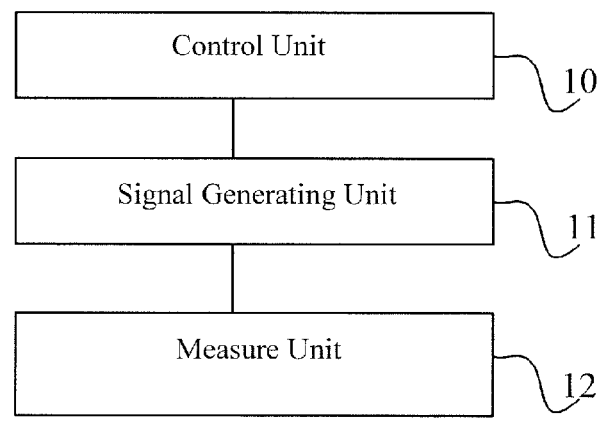
FIG. 6 is a block diagram of a device for testing a TFT on an array substrate according to an embodiment of the disclosed technology.

Also, another embodiment of the disclosed technology provides a device for testing a TFT on an array substrate, as shown in FIG. 6, and this device comprises a control unit 10, a signal generating unit 11, and a measure unit 12.

The control unit 10 is adapted to determine periods and signal amplitudes in each period of the gate electrode test voltage signal and the source-drain-electrode test voltage signal corresponding to the TFT characteristics to be tested, and both the gate electrode test voltage signal and the source-drain-electrode test voltage signal are alternative current signals.

The signal generating unit 11 is adapted to apply the gate electrode test voltage signal to the gate electrode of the TFT to be tested, and applying the source-drain-electrode test voltage signal across the source and drain electrodes of the TFT according to the period and the signal amplitudes in each period of the gate electrode test voltage signal and those of the source-drain-electrode test voltage signal.

The measure unit 12 is adapted to obtain the TFT output signals related to the characteristics to be tested.

The device for testing a TFT on an array substrate according to the embodiment of the disclosed technology employs alternative current signals in testing the TFT, avoiding the time stress effect that occurs when a same signal is applied to TFT for a long time period; furthermore, alternative current signals are more approximate to the real driving voltage signals. Thus, the test results can be more accurate, more precise characteristics of the TFT in operation can be obtained, and it is helpful to reduce the time for examining TFT-LCD design and quality.

The device according to the embodiment of the disclosed technology can be adapted to test the TFT characteristics, such as transfer characteristic, output characteristic, and the like.

In one example, the control unit 10 may be used to determine the periods and the signal amplitudes in each period of the gate electrode test voltage signal and the source-drain-electrode test voltage signal corresponding to the TFT characteristics to be tested according to an instruction of a user; or in another example, the control unit 10 may be used to determine the periods of the gate electrode test voltage signal and the source-drain-electrode test voltage signal corresponding to the TFT characteristics to be tested according to the resolution of the array substrate where the TFT to be tested are provided, and to determine the signal amplitudes in each period of the gate electrode test voltage signal and the source-drain-electrode test voltage signal corresponding to the TFT characteristics to be tested according to the design parameters in TFT design, including the values of the gate electrode voltage and the source-drain-electrode voltage.

In addition, the control unit 10 may be used to control the time sequence relationship between the gate electrode test voltage signal and the source-drain-electrode test voltage signal when the signals are applied, and one exemplary time sequence can be found in FIG. 3 for satisfying the time sequence relationship between the forming of the conductive channel and the generating of the current $I_d$. In detail, the control unit 10 controls the signal generating unit 11 to first apply the gate electrode test voltage signal to the gate electrode of the TFT before the source-drain-electrode test voltage signal is applied across the source and drain electrodes of the TFT.

Figure 7:
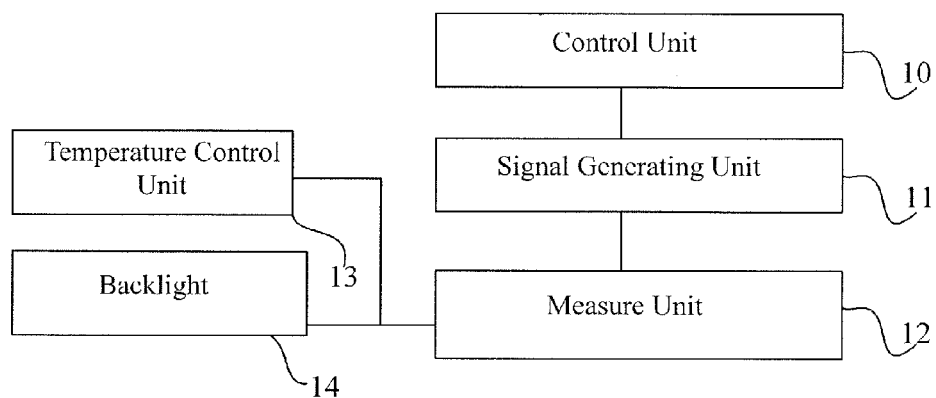
FIG. 7 is another block diagram of a device for testing a TFT on an array substrate according to an embodiment of the disclosed technology.

As shown in FIG. 7, the device according to the embodiment of the disclosed technology further comprises a temperature control unit 13 and a backlight 14.

The temperature control unit 13 is adapted to control the environmental temperature of the TFT to be tested and make it the same or similar to the working temperature when the TFT is in actual operation. The backlight 14 is adapted to illuminate the TFT with light having brightness the same or similar to that of the light from a backlight when the TFT is in actual operation.

In this way, the test environment for the TFT would be more close to the environment in which the TFT is in actual operation, which is helpful to further improve the accuracy of test results and easier to catch the problem occurring when the TFT is in actual operation. Also, when a failure analysis is performed, this setting can reconstruct the conditions where the failure occurs and is helpful to determine the reason(s) of the failure.

Figure 8:
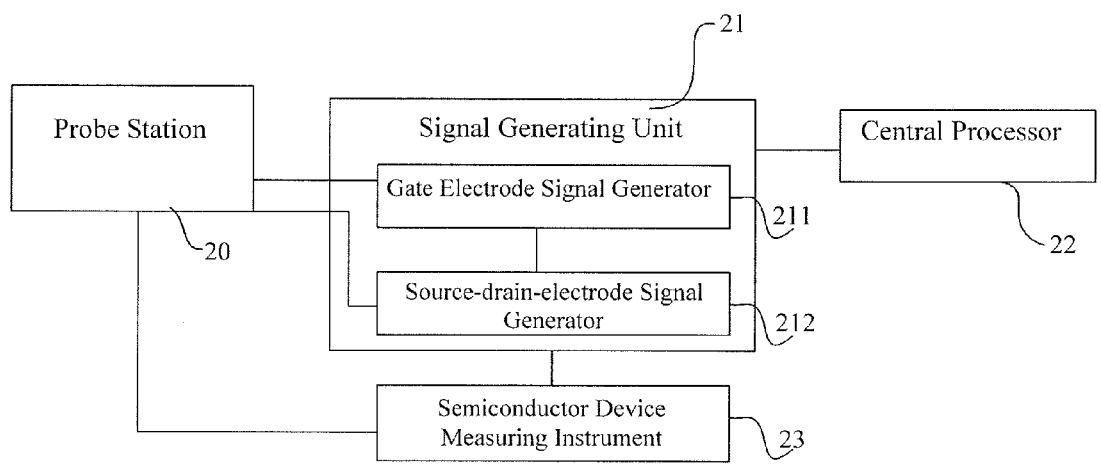
FIG. 8 is further another block diagram of a device for testing a TFT on an array substrate according to an embodiment of the disclosed technology.

Further as shown in FIG. 8, in an example, the device according to the embodiment of the disclosed technology further comprises a probe station 20, a signal generating unit 21, a central processor 22 (an example of the control unit), and a semiconductor device measuring instrument 23 (an example of the measure unit).

The probe station 20 with probes is adapted to connect with the electrodes (terminals) of the TFT so that signals can be input thereto and output therefrom.

The signal generating unit 21 comprises a gate electrode signal generator 211 for applying the gate electrode test voltage signal for testing and a source-drain-electrode signal generator 212 for applying the source-drain-electrode test voltage signal for testing. The probe of the probe station 20 in connection with the gate electrode of the TFT is connected with the gate electrode signal generator 211, and the probe of the probe station 20 in connection with the drain electrode of the TFT is connected with the source-drain-electrode signal generator 212.

The central processor 22 (control unit) is connected with the signal generating unit 21 for determining the periods and signal amplitudes and controlling the time sequence relationships between the signals.

The semiconductor device measuring instrument 23 (measure unit) is adapted to connect with the probe of the probe station 20 in connection with the drain electrode of the TFT under test and obtain the drain current ($I_d$) when measuring the transfer and output characteristics of the TFT.

Those skilled in the related technical field can understand that the above described method(s) can be implemented entirely or partially with hardware, software, or firmware comprising program instructions and the program can be stored in a computer readable media. The media comprise, but not limited to, ROM, RAM, magnetic disk, optical disk or the like for storing a computer executable program.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. A method for testing a thin film transistor (TFT) provided on an array substrate comprising:
    determining a period of a gate electrode test voltage signal and a period of a source-drain-electrode test voltage signal corresponding to TFT characteristics to be tested and signal amplitudes in each period, wherein both the gate electrode test voltage signal and the source-drain-electrode test voltage signal are alternating voltage signals;
    according to the period and the signal amplitude of the gate electrode test voltage signal and those of the source-drain-electrode test voltage signal, applying the gate electrode test voltage signal to a gate electrode of the TFT, and applying the source-drain-electrode test voltage signal across the source and drain electrodes of the TFT; and
    obtaining TFT output signals related to the TFT characteristics to be tested,
    wherein the period of the gate electrode test voltage signal and the period of the source-drain-electrode test voltage signal are constant successive periods,
    wherein the gate electrode test voltage signal has different signal amplitudes in different periods.

2. The method according to claim 1, wherein determining a period of a gate electrode test voltage signal and a period of a source-drain-electrode test voltage signal corresponding to TFT characteristics to be tested and signal amplitudes in each period comprises:
    determining the periods of the gate electrode test voltage signal and the source-drain-electrode test voltage signal corresponding to the TFT characteristics to be tested according to a resolution of the array substrate, and the signal amplitudes in each period of the gate electrode test voltage signal and the source-drain-electrode test voltage signal corresponding to the TFT characteristics to be tested according to design parameters in TFT design.

3. The method according to claim 2, wherein the TFT characteristics to be tested comprise transfer characteristic or output characteristic.

4. The method according to claim 1, wherein the gate electrode test voltage signal is applied to the gate electrode of the TFT before the source-drain-electrode test voltage signal is applied across the source and drain electrodes of the TFT.

5. The method according to claim 4, wherein the TFT characteristics to be tested comprise transfer characteristic or output characteristic.

6. The method according to claim 1, wherein before applying the gate electrode test voltage signal to the gate electrode of the TFT, and applying the source-drain-electrode test voltage signal across the source and drain electrodes of the TFT, the method comprises:
    controlling an environmental temperature of the TFT and making it the same or similar to a working temperature when the TFT is in actual operation, and
    illuminating the TFT with light having brightness the same or similar to that of the light from a backlight when the TFT is in actual operation.

7. The method according to claim 6, wherein the TFT characteristics to be tested comprise transfer characteristic or output characteristic.

8. The method according to claim 1, wherein the TFT characteristics to be tested comprise transfer characteristic or output characteristic.

9. The method according to claim 1, wherein determining a period of a gate electrode test voltage signal and a period of a source-drain-electrode test voltage signal corresponding to TFT characteristics to be tested and signal amplitudes in each period comprises:
    determining the periods and the signal amplitudes of the gate electrode test voltage signal and the source-drain-electrode test voltage signal corresponding to the TFT characteristics to be tested according to an instruction of a user.

10. A device for testing a thin film transistor (TFT) provided on an array substrate comprising:
    a control unit adapted to determine a period of a gate electrode test voltage signal and a period of a source-drain-electrode test voltage signal corresponding to TFT characteristics to be tested and signal amplitudes in each period, wherein both the gate electrode test voltage signal and the source-drain-electrode test voltage signal are alternating voltage signals;

a signal generating unit adapted to apply the gate electrode test voltage signal to a gate electrode of the TFT, and applying the source-drain-electrode test voltage signal across the source and drain electrodes of the TFT according to the period and the signal amplitude of the gate electrode test voltage signal and those of the source-drain-electrode test voltage signal; and a measure unit adapted to obtain TFT output signals related to the TFT characteristics to be tested, wherein the period of the gate electrode test voltage signal and the period of the source-drain-electrode test voltage signal are constant successive periods, wherein the gate electrode test voltage signal has different signal amplitudes in different periods.

11. The device according to claim 10, the control unit is adapted to determine the periods of the gate electrode test voltage signal and the source-drain-electrode test voltage signal corresponding to the TFT characteristics to be tested according to a resolution of the array substrate, and to determine the signal amplitudes in each period of the gate electrode test voltage signal and the source-drain-electrode test voltage signal corresponding to the TFT characteristics to be tested according to the design parameters in TFT design.

12. The device according to claim 10, wherein the control unit controls the signal generating unit to apply the gate electrode test voltage signal to the gate electrode of the TFT before the source-drain-electrode test voltage signal is applied across the source and drain electrodes of the TFT.

13. The device according to claim 10, further comprising a temperature control unit adapted to control an environmental temperature of the TFT and make it the same or similar to a working temperature when the TFT is in actual operation; and a backlight adapted to illuminate the TFT with light having brightness the same or similar to that of the light from a backlight when the TFT is in actual operation.

14. The device according to claim 10, wherein the control unit is adapted to determine the period of the gate electrode test voltage signal and the period of the source-drain-electrode test voltage signal corresponding to TFT characteristics to be tested and the signal amplitudes in each period according to an instruction of a user.

\* \* \* \* \*